United States Patent
Bagchi et al.

(10) Patent No.: US 7,917,114 B2
(45) Date of Patent: Mar. 29, 2011

(54) DC CANCELLATION CIRCUIT

(75) Inventors: Amit Bagchi, Mountain View, CA (US); Rohit Gaikwad, San Diego, CA (US)

(73) Assignee: Broadcom Corp.

( * ) Notice: Subject to any disclaimer, the term of this patent is extended or adjusted under 35 U.S.C. 154(b) by 1008 days.

(21) Appl. No.: 11/392,868

(22) Filed: Mar. 30, 2006

(65) Prior Publication Data

US 2006/0223472 A1    Oct. 5, 2006

Related U.S. Application Data

(60) Provisional application No. 60/666,314, filed on Mar. 30, 2005.

(51) Int. Cl.
*H04B 1/06* (2006.01)
*H04B 7/00* (2006.01)
*H04B 1/28* (2006.01)

(52) U.S. Cl. ............... 455/232.1; 455/240.1; 455/248.1; 455/252.1; 455/333; 330/86; 330/259

(58) Field of Classification Search ................... 455/136, 455/138, 232.1–253.2, 296, 333; 375/317–319, 375/345; 330/83, 86, 259–260, 282
See application file for complete search history.

(56) References Cited

U.S. PATENT DOCUMENTS

| | | | |
|---|---|---|---|
| 6,407,630 B1 * | 6/2002 | Yao et al. | 330/9 |
| 6,429,697 B1 * | 8/2002 | Amazeen et al. | 327/87 |
| 6,516,187 B1 * | 2/2003 | Williams et al. | 455/313 |
| 6,577,188 B2 * | 6/2003 | Ueno et al. | 330/85 |
| 7,020,449 B2 * | 3/2006 | Shi | 455/234.1 |
| 7,127,224 B2 * | 10/2006 | Ichihara | 455/240.1 |
| 7,253,680 B2 * | 8/2007 | Laletin | 330/69 |
| 7,403,760 B1 * | 7/2008 | Gao | 455/312 |
| 2003/0128776 A1 * | 7/2003 | Rawlins et al. | 375/319 |

* cited by examiner

*Primary Examiner* — Simon D Nguyen
(74) *Attorney, Agent, or Firm* — McAndrews, Held & Malloy, Ltd.

(57) ABSTRACT

The present invention relates to a DC offset canceling circuit. In one aspect of the invention, a DC offset canceling circuit with independently configurable gain and roll-off frequency is provided. In one embodiment of the present invention, the DC offset canceling circuit is used in the receive path of a down-conversion wireless receiver. In another aspect of the invention, a method for independently varying the gain and the roll-off frequency of the DC offset canceling circuit is provided. In one embodiment, the method is used to independently operate a gain control scheme and a DC offset cancellation strategy in a DC canceling circuit.

16 Claims, 13 Drawing Sheets

DC CANCELLATION CIRCUIT

CROSS-REFERENCE TO RELATED APPLICATION(S)

This application is a non-provisional of U.S. Provisional Application No. 60/666,314, filed Mar. 30, 2005 which is incorporated herein by reference in its entirety.

FIELD OF THE INVENTION

The present invention relates generally to DC offset cancellation. More particularly, the invention relates to a DC offset canceling circuit for use in direct-conversion receivers.

BACKGROUND OF THE INVENTION

Heterodyne receivers are one type of receivers used for RF signal down-conversion. Heterodyne receivers work by down-converting the RF signal into an intermediate frequency (IF) signal, filtering the IF signal to remove any interfering signals, and amplifying the filtered signal before another step of down-conversion to a baseband frequency.

Another promising RF down-conversion architecture, direct-conversion, eliminates the conversion-to-IF step, and directly down-converts the RF signal to baseband frequency. Without the IF stage, several elements of a wireless receiver can be eliminated effectively reducing its size and cost.

Despite its size and cost advantages however, direct-conversion inherently suffers from a "self-mixing" problem. As an undesirable effect of the local oscillator signal mixing with the received RF signal, self-mixing results in a DC offset being added to the down-converted signal which may saturate circuit elements in following stages of the receiver depending on the applied gain in these stages. Another source of DC offset, since gain is applied after down-conversion, is due to the gain stages introducing residual offsets due to imperfections.

While, typically, a DC offset can be easily removed using a high-pass filter circuit with an appropriately set roll-off frequency, the problem is more challenging in the case of a wireless receiver circuit. In a wireless receiver, gain control is needed due to the varying nature of received signal levels. It desirable for several reasons, among which is reducing the area of the receiver, to implement a mixed gain and high-pass filtering architecture as opposed to having separate cascaded gain and high-pass filtering elements. In this architecture, as a result, the roll-off frequency of a wireless receiver circuit changes constantly with changes in the gain of the circuit. A tradeoff therefore exists between gain control and DC offset cancellation in the wireless receiver.

What is needed therefore is a wireless receiver circuit with independently configurable gain and roll-off frequency. Further, a method for varying the gain and the roll-off frequency of the receiver independently of each other is also needed.

BRIEF SUMMARY OF THE INVENTION

The present invention relates to a DC offset canceling circuit.

In one aspect of the invention, a DC offset canceling circuit with independently configurable gain control and roll-off frequency control is provided. In one embodiment of the present invention, the DC offset canceling circuit is used in the receive path of a down-conversion wireless receiver.

In another aspect of the invention, a method for independently varying the gain and the roll-off frequency of the DC offset canceling circuit is provided. In one embodiment, the method is used to independently operate a gain control scheme and a DC offset cancellation strategy in a DC canceling circuit.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Typical Receive Path Implementation

Figure 1:
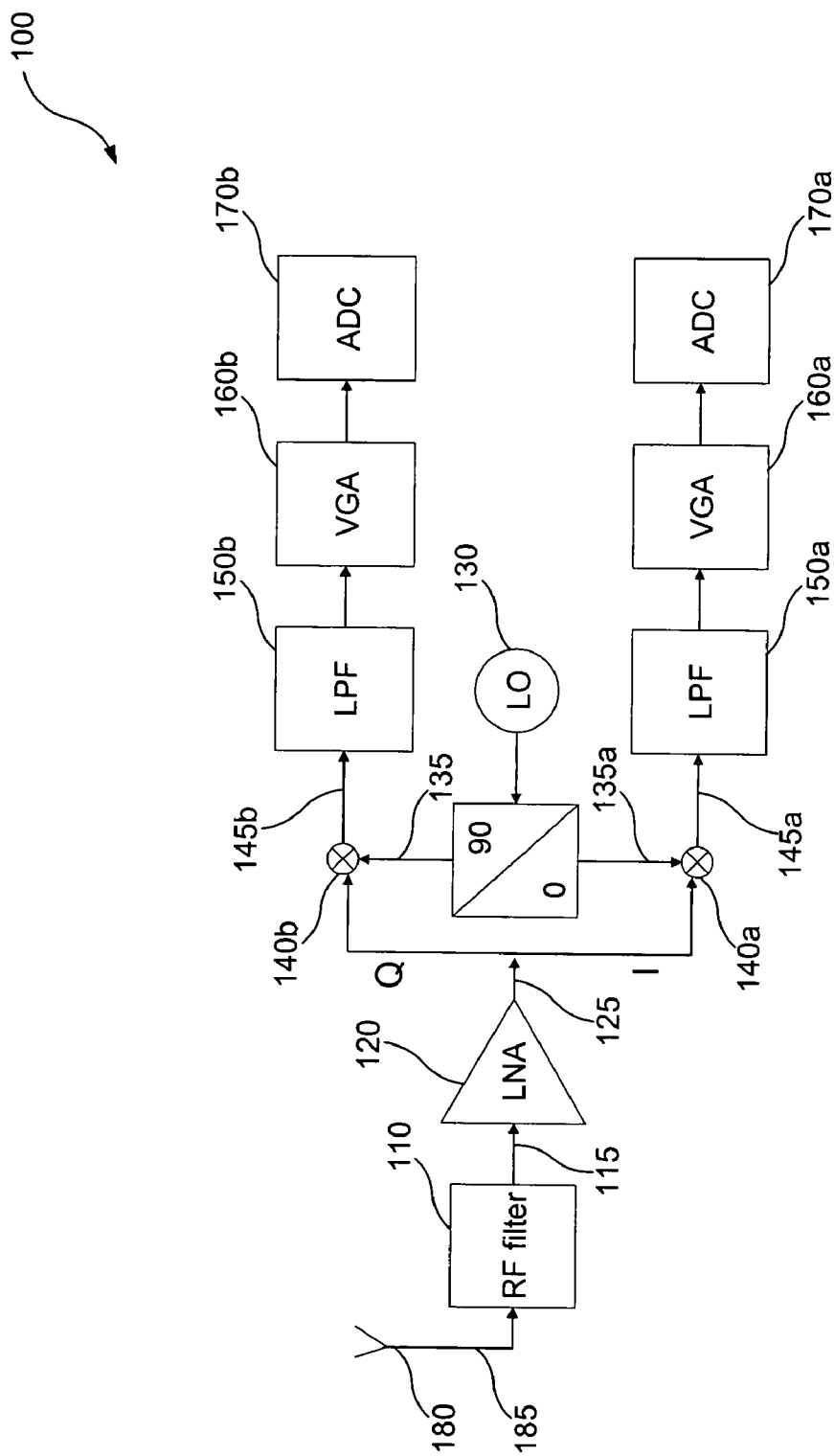
FIG. 1 is a block diagram that illustrates a receive path of a wireless direct-conversion receiver.

FIG. 1 is a block diagram that illustrates a receive path 100 of a wireless direct-conversion receiver. The receive path includes a radio frequency (RF) filter 110, a low-noise amplifier (LNA) 120, a local oscillator (LO) 130, and identical I and Q channels. Each of the I and Q channels includes a mixer 140, a low-pass filter (LPF) 150, a variable gain amplifier (VGA) 160, and an analog-to-digital converter (ADC) 170.

Operation of the elements of receive path 100 in the reception of a signal of interest can be described as follows with reference to FIG. 1. RF filter 110 receives a signal 185 from wireless antenna 180. Signal 185, in addition to containing the signal of interest, typically also includes a superposition of other signals of various amplitude levels and frequencies. RF filter 110 filters received signal 185 as to only pass a frequency band centered at the carrier frequency. At the output of RF filter 110, RF filtered signal 115 however is typically very weak.

Still referring to FIG. 1, LNA 120 is characterized by its ability to capture and amplify very weak signals at a defined frequency. Signal 115 is passed through LNA 120 to generate an amplified signal 125. At the output of LNA 120, signal 125 is at a level sufficient for frequency down-conversion, and is fed simultaneously into each of the I and Q channels of receive path 100. The processing of signal 125 is identical in both of the I and Q channels, and will now be described with reference to FIG. 1.

LO 130 generates a local oscillator signal 135 having a frequency equal to the carrier frequency of signal 125. Mixers 140a,b mix signal 125 with a shifted version of local oscillator signal 135. Typically, signal 125 is mixed with an in-phase version 135a of LO signal 135 in the I channel and a 90°-shifted version 135b of LO signal 135 in the Q channel. Resulting signals 145a and 145b are down-converted signals having a baseband frequency and are 90° out-of-phase of each other. In other words, signals 145a and 145b have information content around zero frequency.

Ideally, signals 145a and 145b have no content at zero frequency. However, when "self-mixing" occurs, mixers 140a,b "leak" LO signal 135 into signal 125. LO signal 135 then is down-converted together with signal 125, resulting in a DC offset being added to signals 145a and 145b.

Subsequently, when each of signals 145a and 145b is fed into LPF 150a,b, LPF 150a,b remove any remaining higher frequency signals but do not eliminate the DC offset. In the next stages of the receive path, removal of the DC offset occurs using a combination of one or more filters depending on the quality of the wireless receiver. It is essential that the DC offset is removed from the received signal before reaching ADC 170 in order to be able to use the full resolution range of the ADC. This is because the DC offset shifts the level of the ADC input signal forcing the signal to occupy a smaller set of the full ADC range before clipping.

In the illustration of FIG. 1, VGA 160 is the element of receive path 100 responsible for the elimination of the DC offset. As it can be understood by a person skilled in the art(s), a plurality of VGAs 160 may be used in a receive path in combination with other filters as necessary by the wireless receiver design. Typically also, VGA 160 provides a variable gain to control the amplification of received signals due to the volatility of wireless signals' levels.

As described earlier, a challenge faced in the design of wireless receivers lies in the tradeoff that exists between DC offset cancellation and gain control in the receive path. The object of this invention is a DC cancellation circuit with variable gain, and also with the additional feature of independently configuring the gain of the receiver circuit and the ability thereof to remove any DC offset.

DC Offset Cancellation Circuit

Figure 2:
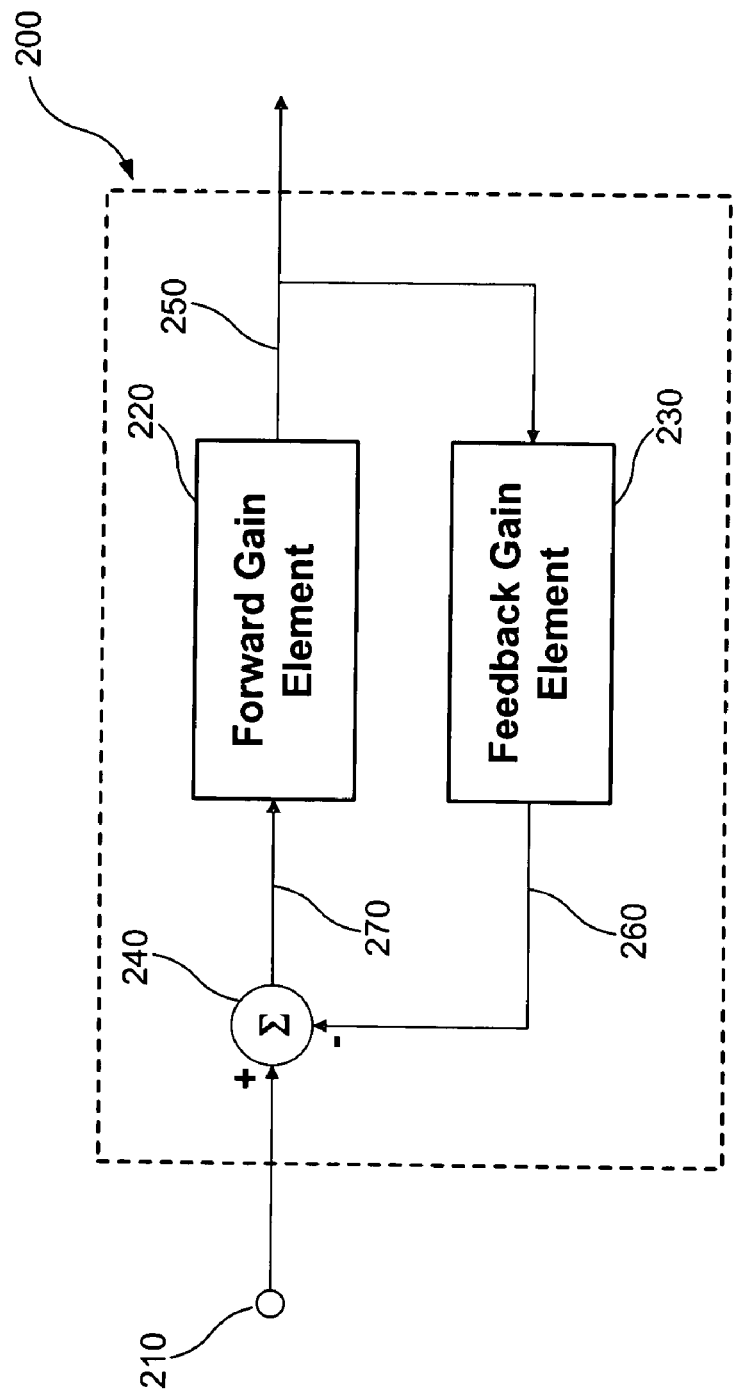
FIG. 2 illustrates a block diagram of a DC cancellation circuit according to an embodiment of the present invention.

FIG. 2 illustrates a DC cancellation circuit 200 according to an embodiment of the present invention. DC cancellation circuit 200 can be used as VGA 160. System 200 includes a forward gain element 220, a feedback gain element 230, and a summer 240.

An input signal 210 fed into system 200 is first acted upon by forward gain element 220. In an embodiment, forward gain element 220 amplifies input signal 210 equally for all frequencies of input signal 210. In another embodiment, forward gain element 220 selectively amplifies frequencies of input signal 210.

The output signal 250 of forward gain element 220 is then fed back into the feedback gain element 230 of system 200. Similar to the forward gain element, feedback gain element may amplify equally or selectively frequencies of output signal 250.

Summer 240 subtracts the output 260 of feedback gain element 230 from input signal 210 before being fed again into the forward gain element. Effectively then, the forward gain element 220 acts upon the difference 270 between input signal 210 and output 260 of the feedback gain element 230. Output 250, also the output of system 200, is an amplified version of the difference signal 270.

In a DC cancellation circuit, input signal 210 is a baseband signal having information content located around zero frequency and a DC pulse at the zero frequency. In a time domain representation, input signal 210 comprises a slowly varying information signal shifted upwards or downwards by a DC level.

In steady-state, output 250 of system 200 contains only the information signal portion of input signal 210 with the DC content suppressed. Since difference signal 270 is just a scaled version of output signal 250, signal 270 also only contains the information signal portion of input signal 210. This implies that signal 260 is the DC portion of input signal 210.

In effect then, forward gain element 220 passes all portions of difference signal 270. In one embodiment, forward gain element 220 is an all-pass filter. On the other hand, feedback gain element 230 passes the DC portion of input signal 210, and blocks the information signal portion of input signal 210. In one embodiment, feedback gain element 230 is a low-pass filter that amplifies content at the zero frequency, and attenuates content away from the zero frequency. In practice, the DC portion of signal 260 is very large compared to the information signal portion of signal 260 that the information signal portion is considered negligible.

Figure 3:
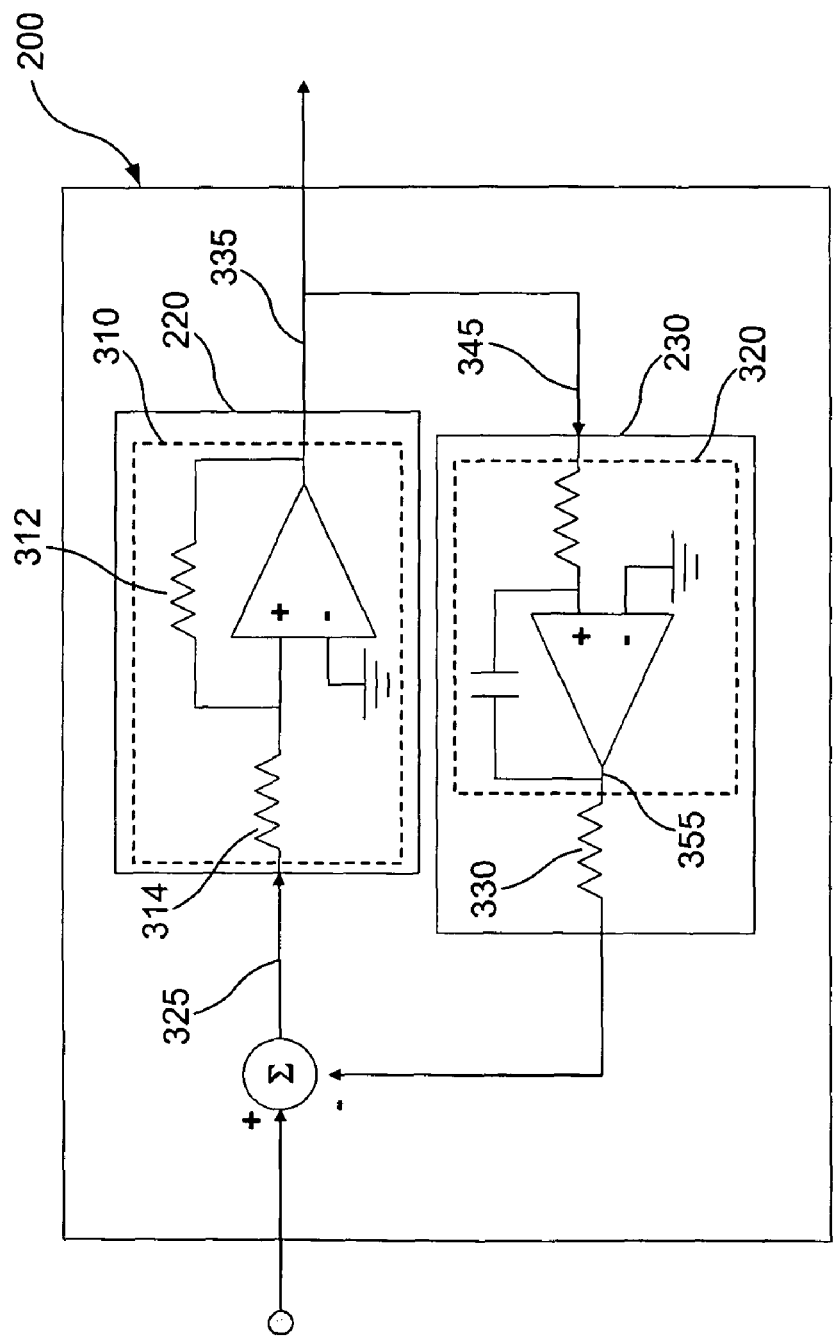
FIG. 3 illustrates a block diagram of a DC cancellation circuit according to an embodiment of the present invention.

FIG. 3 illustrates another block diagram of DC cancellation circuit 200 according to an embodiment of the present invention. In FIG. 3, forward gain element 220 and feedback gain element 230 are illustrated in a circuit-level representation. In an embodiment, forward gain element 220 comprises a gain amplifier having constant gain response for all frequencies. In the embodiment of FIG. 3, forward gain element 220 is illustrated as an inverting amplifier circuit 310. The invention is not, however, limited to this embodiment. As it can be understood by a person skilled in the art(s), forward gain element 220 can be implemented using any operational amplifier circuit including, but not limited to, non-inverting amplifiers, summing amplifiers, and follower circuits.

Referring to FIG. 3, feedback gain element 230 is illustrated as an integrator circuit 320 followed in series by a scaling impedance 330. The invention is not, however, limited to this embodiment. As it can be understood by a person skilled in the art(s), feedback gain element 230 can be implemented using a variety of operational amplifier circuits with memory including, but not limited to, differential, non-inverting, and summing integrators as well as active filters.

Still referring to FIG. 3, scaling impedance 330 is illustrated as a real resistive impedance. The present invention however is not limited to the embodiment of FIG. 3. As it can be understood by a person skilled in the art(s), scaling impedance 330 can be implemented using a variety of impedance configurations including real and complex impedance circuits.

Figure 6A:
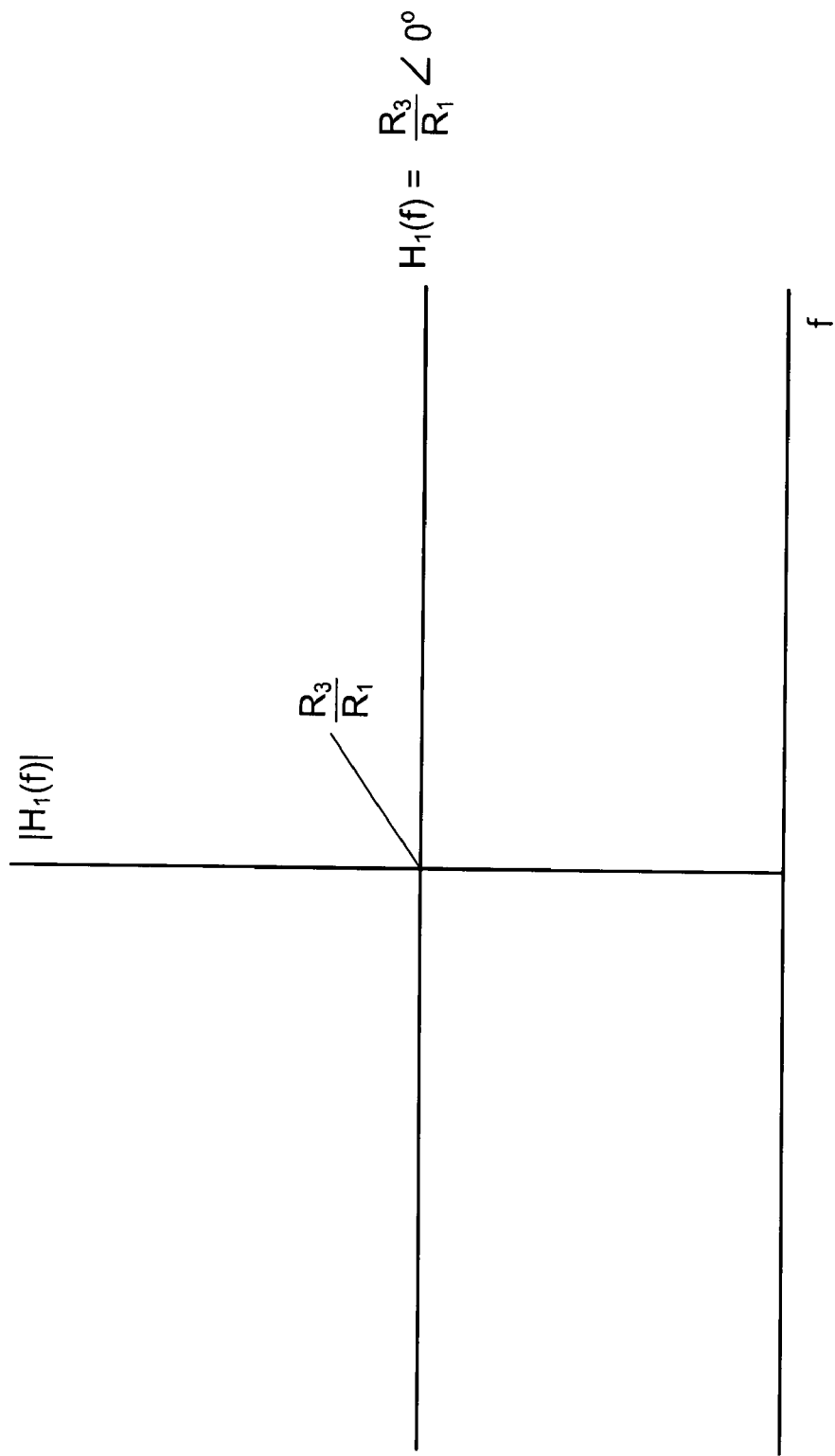
FIG. 6A illustrates a gain frequency response of a first gain element of the circuit of FIG. 3.
Figure 6B:
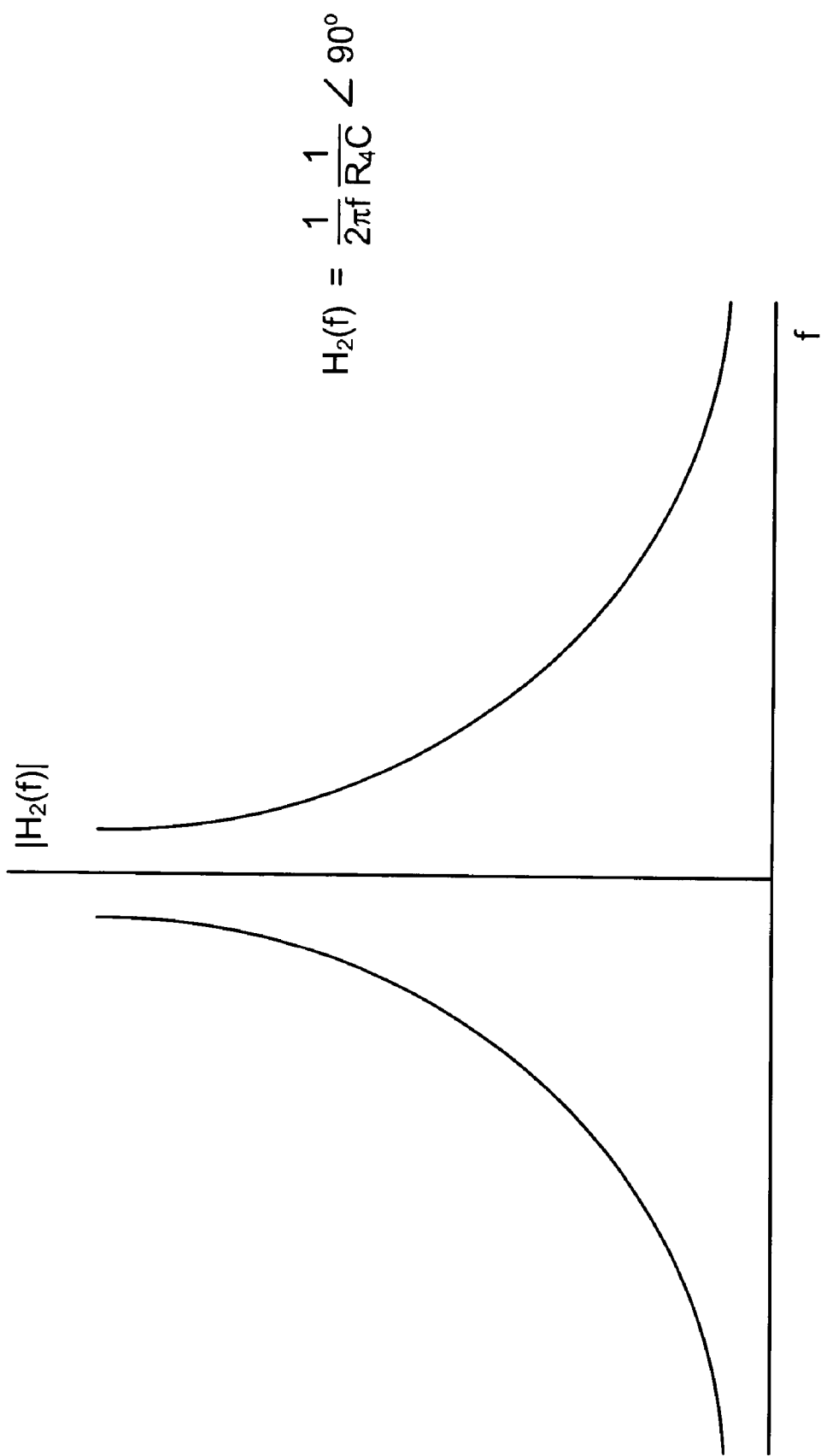
FIG. 6B illustrates a gain frequency response of a second gain element of the circuit of FIG. 3.

FIGS. 6A and 6B illustrate the gain frequency response of inverting amplifier 310 and integrator 320, respectively, of the circuit of FIG. 3. Referring to FIG. 6A, inverting amplifier 310 is an all-pass filter having a constant gain response for all frequencies. Referring to FIG. 3, inverting amplifier 310 scales input signal 325 by the negative of the ratio of impedance 312 and impedance 314. In other words, amplifier 310 has a gain defined as $-(R_3/R_1)$. Output signal 335 of inverting amplifier 310 is inverted, but in-phase, relative to input signal 325.

Referring to FIG. 6B, integrator 320 acts as a low-pass filter having a complex-valued gain response inversely proportional to frequency. Referring to FIG. 3, integrator 320 scales input signal 345 proportionally to (1/f), where f is the frequency of input signal 345. In addition, output signal 355 of integrator 320 is inverted and 90° out-of-phase relative to input signal 345.

Figure 4:
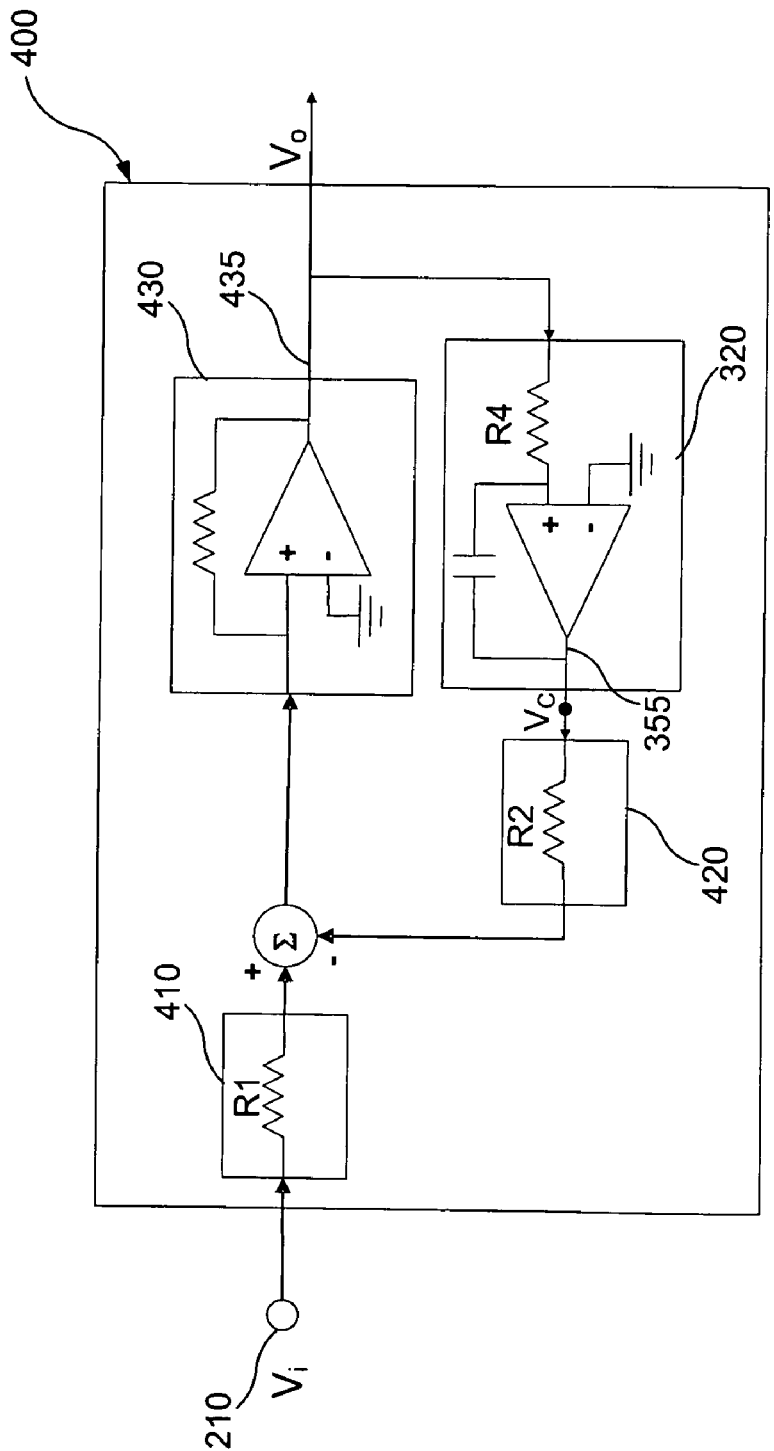
FIG. 4 illustrates a block diagram of a DC cancellation circuit according to an embodiment of the present invention.

FIG. 4 illustrates another block diagram 400 of a DC cancellation circuit according to an embodiment of the present invention. In the embodiment of FIG. 4, blocks 410, 420, and 430 form a summing amplifier circuit having as inputs input signal 210 and the negative inverse of signal 355. Referring to FIG. 4, output signal 435 of the summing amplifier can be described as follows:

$$V_o(t) = -\left(\frac{R_3}{R_1}V_i(t) - \frac{R_3}{R_2}V_C(t)\right) \quad (1)$$

As can be seen from the above equation, input signal $V_i(t)$ and signal $V_C(t)$ are scaled using different gain constants when passed through the summing amplifier. In an embodiment, $V_C(t)$ is a scaled version of the DC offset comprised in input signal 210. To cancel any DC offset at output signal $V_o(t)$ therefore, special tuning of resistive parameters $R_1$, $R_2$, and $R_3$ is required. In an embodiment, the ratio $R_2/R_1$ should equal the amount of gain scaling applied to $V_C(t)$ relative to $V_i(t)$.

Figure 5:
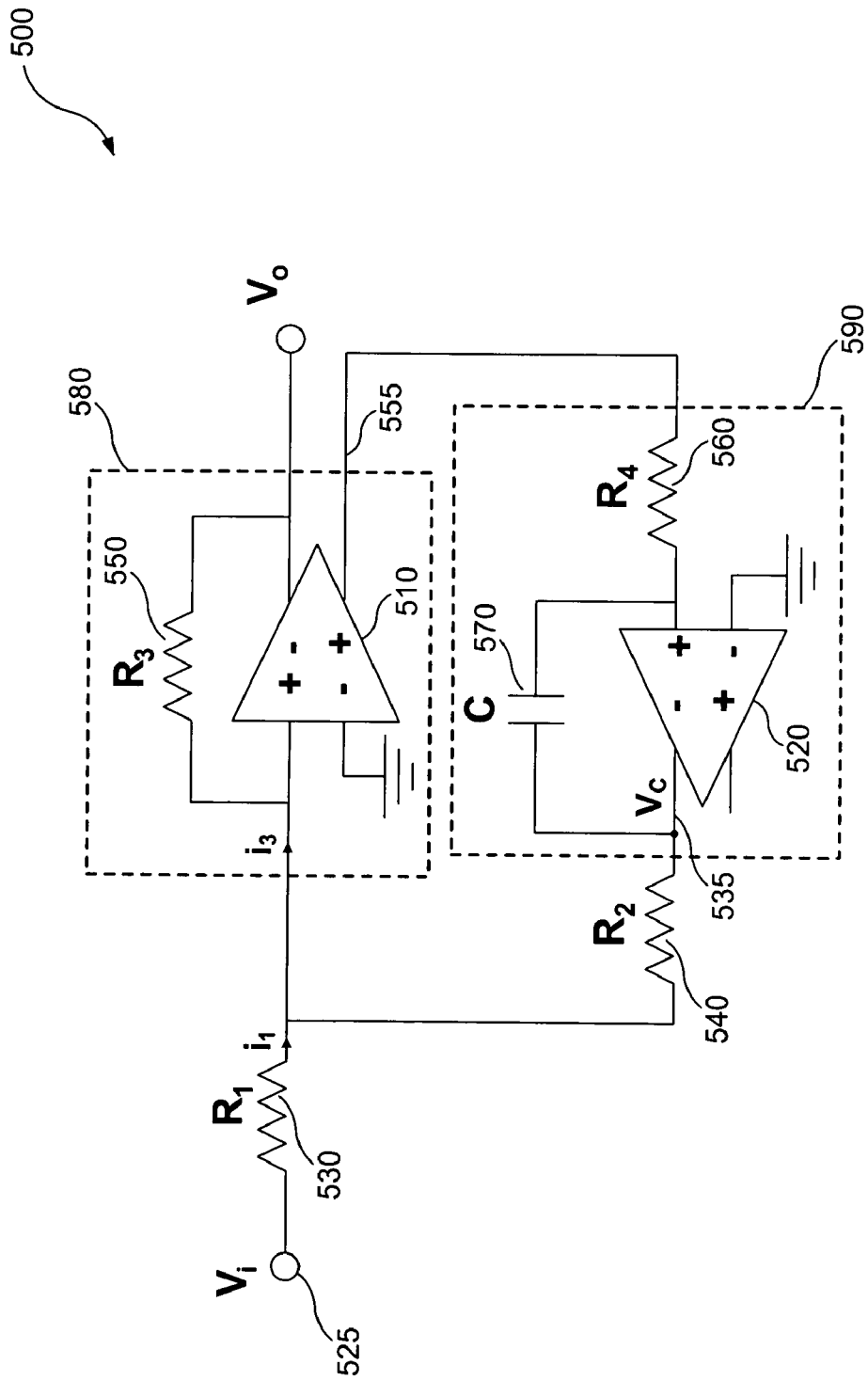
FIG. 5 is a circuit level representation of a DC cancellation circuit according to an embodiment of the present invention.

FIG. 5 illustrates a circuit level implementation of a DC cancellation circuit 500 according to an embodiment of the present invention. Circuit 500 includes a first operational amplifier 510, a second operational amplifier 520, a first impedance 530, a second impedance 540, a third impedance 550, a fourth impedance 560, and a capacitance 570.

In one embodiment, the first operational amplifier 510 together with the first impedance 530, the second impedance 540, and the third impedance 550 form a summing amplifier circuit 580 having two input terminals at nodes 525 and 535 and an output terminal at node 555 of circuit 500. The second operational amplifier 520 together with the fourth impedance 560 and the capacitance 570 form an integrator circuit 590 having an input terminal at node 555 and an output terminal at node 535 of circuit 500. In other words, the output of summing amplifier 580 is coupled to the input of integrator 590. In turn, the output of integrator 590 is coupled to an input of summing amplifier 580. In one embodiment, integrator 590 provides a feedback loop for summing amplifier 580.

Referring to FIG. 5, output 555 of summing amplifier 580 is an inverted version of the sum of scaled inputs 525 and 535. In one embodiment, input 525 is scaled by a ratio of the third impedance 550 and the first impedance 530, while input 535 is scaled by a ratio of the third impedance 550 and the second impedance 540. Therefore, given an input 525 containing a DC offset, a special tuning of impedances 530, 540, and 550 may be needed to eliminate that DC offset as is further discussed below. In one embodiment, the values of impedances 530, 540, and 550 are tunable.

A DC Cancellation Example

Figure 7A:
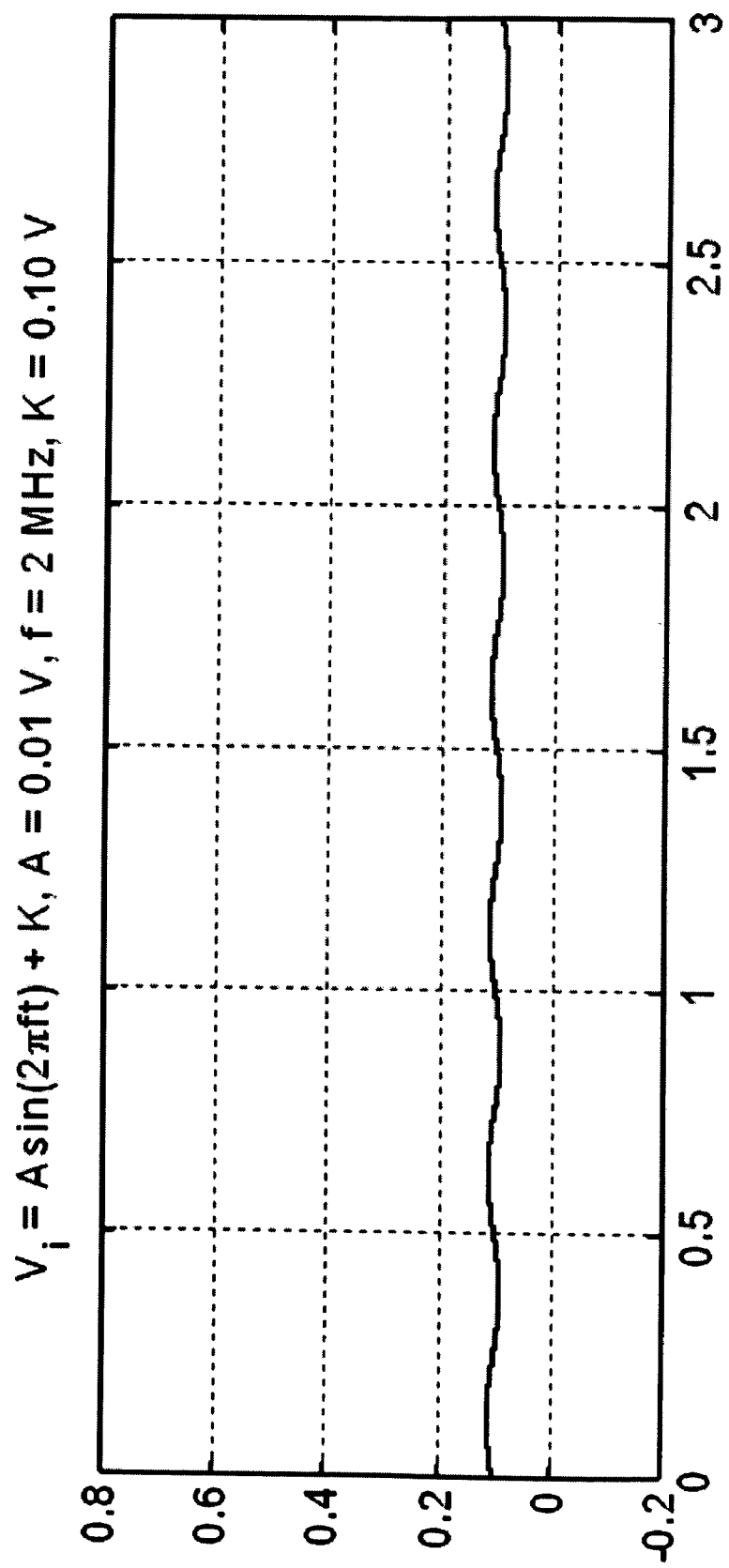
FIGS. 7A-7C illustrate time domain representations of signals at different nodes of the circuit of FIG. 5 in response to an example input signal.
Figure 7B:
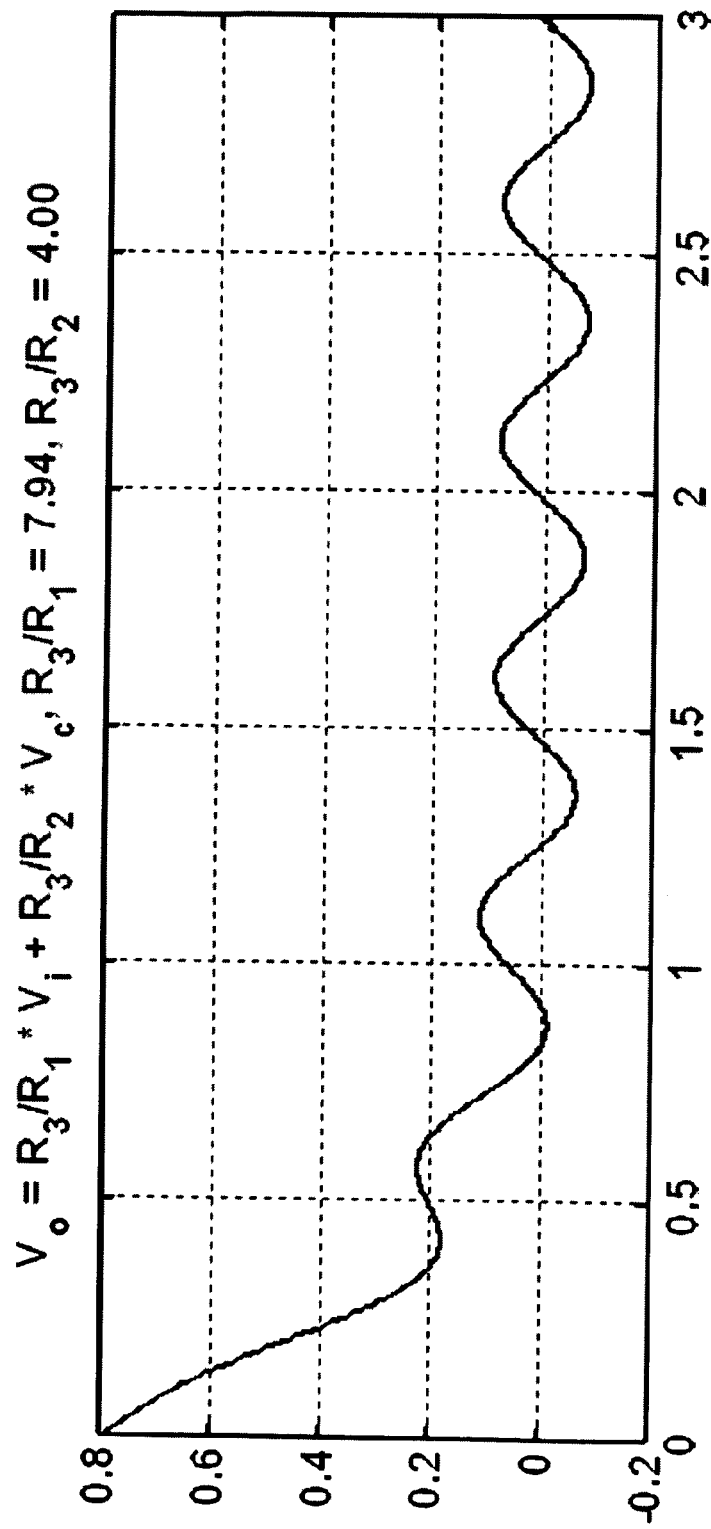
Figure 7C:
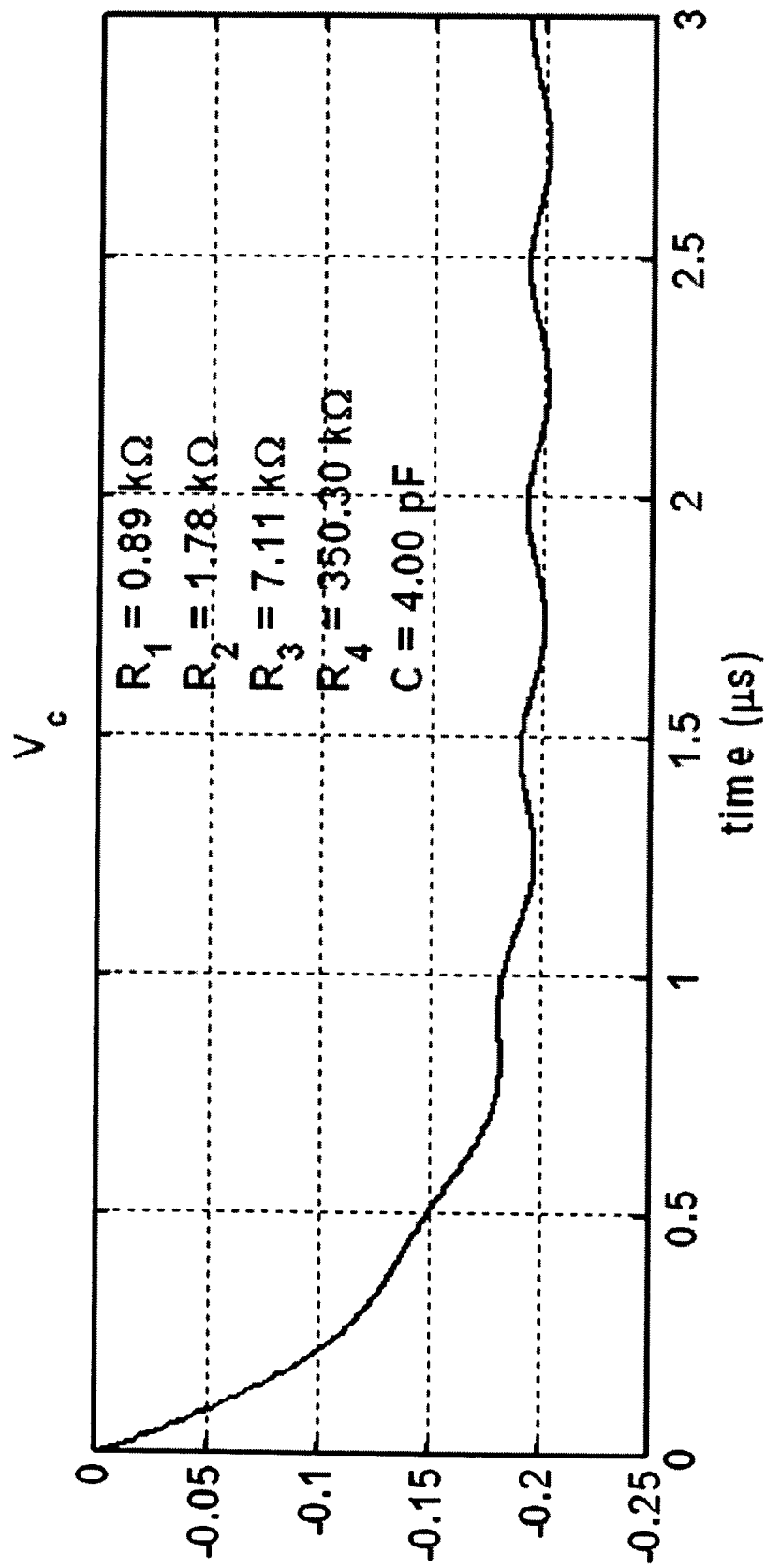

FIGS. 7A-7C illustrate time domain representations of voltage signals at different nodes of the circuit of FIG. 5 in response to an example input signal $V_i$. The example input signal is a sinusoidal signal, which can be described mathematically as $A \sin(2\pi f_c t+\theta)$, where A represents the amplitude of the signal, $f_c$ represents the frequency of the signal, and θ represents the phase of the signal. In the examples of FIGS. 7A-7C, A=0.01 Volts, $f_c$=2 MHz.

FIG. 7A illustrates the example input signal $V_i$ having had a DC offset, K, added to it. The DC offset amplitude K (0.1 Volts) is equal to ten times the amplitude A of the input signal $V_i$.

Subsequently, a 9 dB (a factor of 8) gain is applied to the signal illustrated in FIG. 7A. FIG. 7B illustrates output signal $V_o$ in FIG. 5. FIG. 7C illustrates signal $V_C$ at the output of capacitor C 570 in FIG. 5.

Initially, before any DC correction takes place, the output signal $V_o$ is around 0.88 Volts. As the capacitor voltage begins to track the DC offset, the output signal $V_o$ begins to settle around 0 Volts as the DC offset is removed.

Note that the capacitor voltage $V_c$ in FIG. 7C settles around −0.2 Volts. The capacitor voltage is scaled by the factor $R_3/R_2$ (see equation (1)), which is equal to 4 in the example. This scaled capacitor voltage of −0.8 Volts is subtracted from the signal of FIG. 7A, thereby removing the +0.8 Volts due to the DC offset.

As it can be understood by a person skilled in the art(s), the above operational example is presented for illustrative purposes only. None of the exemplary illustrations described above should be used to limit the scope of the present invention.

Frequency Response Characteristics

To better understand the behavior of the DC cancellation circuit of the present invention, the frequency response of the embodiment of FIG. 5 will now be described. Referring to FIG. 5, the frequency response of the circuit can be calculated by complex impedance analysis using the following equations:

$$i_1(t) = \frac{V_i(t)}{R_1}; \quad (2)$$

$$i_2(t) = \frac{V_C(t)}{R_2}; \quad (3)$$

$$i_3(t) = \frac{V_O(t)}{R_3}; \quad (4)$$

$$i_1(t) + i_2(t) = i_3(t); \quad (5)$$

$$\frac{V_O(t)}{R_4} = -C\frac{dV_C(t)}{dt}; \quad (6)$$

The frequency response of the circuit can then be determined to be equal to:

$$H(f) = \frac{V_O(f)}{V_i(f)} = \frac{R_3}{R_1}\frac{R_2 R_4 C(2\pi f)}{R_3 + R_2 R_4 C(2\pi f)} \quad (7)$$

Figure 6C:
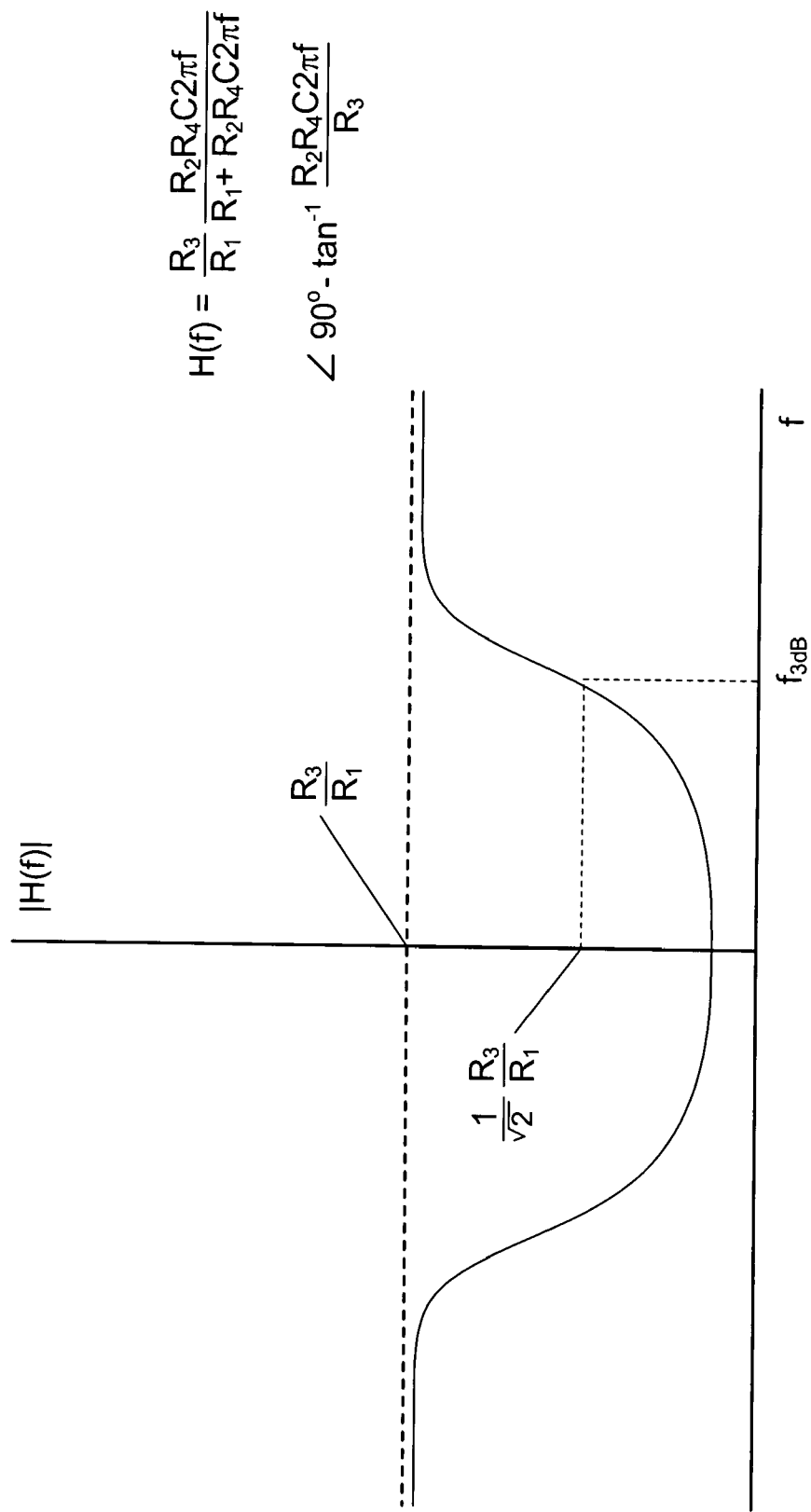
FIG. 6C illustrates a gain frequency response of the circuit of FIG. 5.

FIG. 6C illustrates the frequency response of the circuit embodiment of FIG. 5. As illustrated, the circuit attenuates signals having frequencies that approach the zero frequency. On the other hand, the circuit amplifies signals having frequencies that tend away from the zero frequency. In effect then, the circuit illustrated in FIG. 5 acts as a high-pass filter.

Referring to the frequency response equation above, the gain of the circuit tends towards a maximum of $R_3/R_1$ for high frequency inputs. In one embodiment, for high frequency input signals, the frequency response of the circuit reduces to that of the forward gain element of the circuit. On the other hand, the gain of the circuit tends towards a minimum of zero for low frequency input signals.

The high-pass roll-off frequency of a high-pass filter is the frequency at which the gain is 3 dB lower than the maximum gain of the filter. In terms of power, this corresponds to the frequency where the output power gain is ½ the maximum output power gain of the filter. In practice, the 3 dB roll-off frequency defines the bandwidth of a filter. For the circuit embodiment of FIG. 5, the 3 dB frequency of the circuit occurs for a value of the gain equal to $(1/\sqrt{2})(R_3/R_1)$. This can be determined to be as follows:

$$f_{3dB} = \frac{R_3}{R_2 R_4 C(2\pi)} \quad (8)$$

Gain Control and DC Offset Cancellation

As shown above, the frequency response determines the gain, while the 3 dB frequency defines the bandwidth. As a result, the tradeoff between gain control and DC offset cancellation can be directly analyzed by considering equations (7) and (8) above.

Typically, the signal of interest is located at a baseband frequency near the zero frequency. It is desired therefore that the 3 dB frequency of the circuit be close to zero for information demodulation. In the presence of a DC offset, however, the removal of the DC offset necessitates shifting the 3 dB frequency up in order to quickly attenuate the offset. On the other hand, gain control governs the setting of the gain of the circuit. It is desired that the signal of interest is amplified at the maximum gain of the circuit.

Referring to equations (7) and (8), the gain and the 3 dB frequency of the embodiment of FIG. 5 are directly related being commonly dependent on same component values of the circuit. This dependence, however, results in a variety of signal down-conversion problems in wireless receivers. In one example, a drop in the level of the signal of interest causes gain control to increase the gain of the circuit. This increase in gain, in turn, results in an upward shift in the 3 dB frequency of the circuit, thereby causing the circuit to block the signal of interest. An object of the present invention is a method to unlock this dependence between the gain and the bandwidth in a receive path of a wireless receiver.

Referring to equation (7), the gain of the circuit of FIG. 5 is directly responsive to the ratio $R_3/R_1$. In one embodiment of the method of the present invention, the gain of the circuit is varied by varying the impedance ratio $R_3/R_1$. Since $R_3$ also appears in the numerator of the 3 dB frequency equation, maintaining the value of the 3 dB frequency fixed is done by adjusting $R_2$ and/or $R_4$, thereby compensating for the change in $R_3$. On the other hand, since the gain of the circuit tends towards $R_3/R_1$, the 3 dB frequency of the circuit can be varied independently of the gain of the circuit by adjusting the value of $R_2$ and/or $R_4$. In one embodiment, $R_2$ and $R_4$ are tunable. In another embodiment, in order to achieve a wide range of gain values, the combined value of $R_1$ and $R_3$ is fixed and the ratio $R_3/R_1$ is varied by varying the point at which the circuit is tapped. Referring to FIG. 5, this corresponds to varying the location of node 515 on the impedance circuit formed by $R_1$ and $R_3$.

As a result of the above described method, the dependence between the gain and the 3 dB frequency is removed. Each of the gain and the 3 dB frequency can be set independently of the other. Further, a change in one can be compensated for as not to affect a change in the other.

Also, due to the above method, the circuit can be operated in a plurality of modes defined by the value of the high-pass 3 dB frequency. In one embodiment, the circuit operates in a programmable "slow" mode for information demodulation. In slow mode, the value of the high-pass 3 dB frequency is set according to a frequency of the signal of interest. In one slow mode embodiment, the high-pass 3 dB frequency is lower than the lowest frequency content in the signal of interest.

In another embodiment, the circuit operates in a programmable "fast" mode for DC offset elimination. In fast mode, the value of the high-pass 3 dB frequency is set high enough as to eliminate any DC offset. In one embodiment, a variety of "fast" modes are used interchangeably to eliminate different levels of DC offset at different speeds.

In an embodiment, the circuit is operated in "slow" mode to receive an information signal. The circuit is toggled from "slow" mode to "fast" mode after the received signal is demodulated.

In a further embodiment, the circuit can be operated in a mode suitable for information content close to DC. In this embodiment, the high-pass 3 dB frequency is decreased to near zero. In the circuit of FIG. 5, for example, this can be achieved by increasing the value of $R_4$ to drive the high-pass 3 dB frequency to zero. Accordingly, the circuit stops to track the DC offset in this embodiment.

Figure 9:
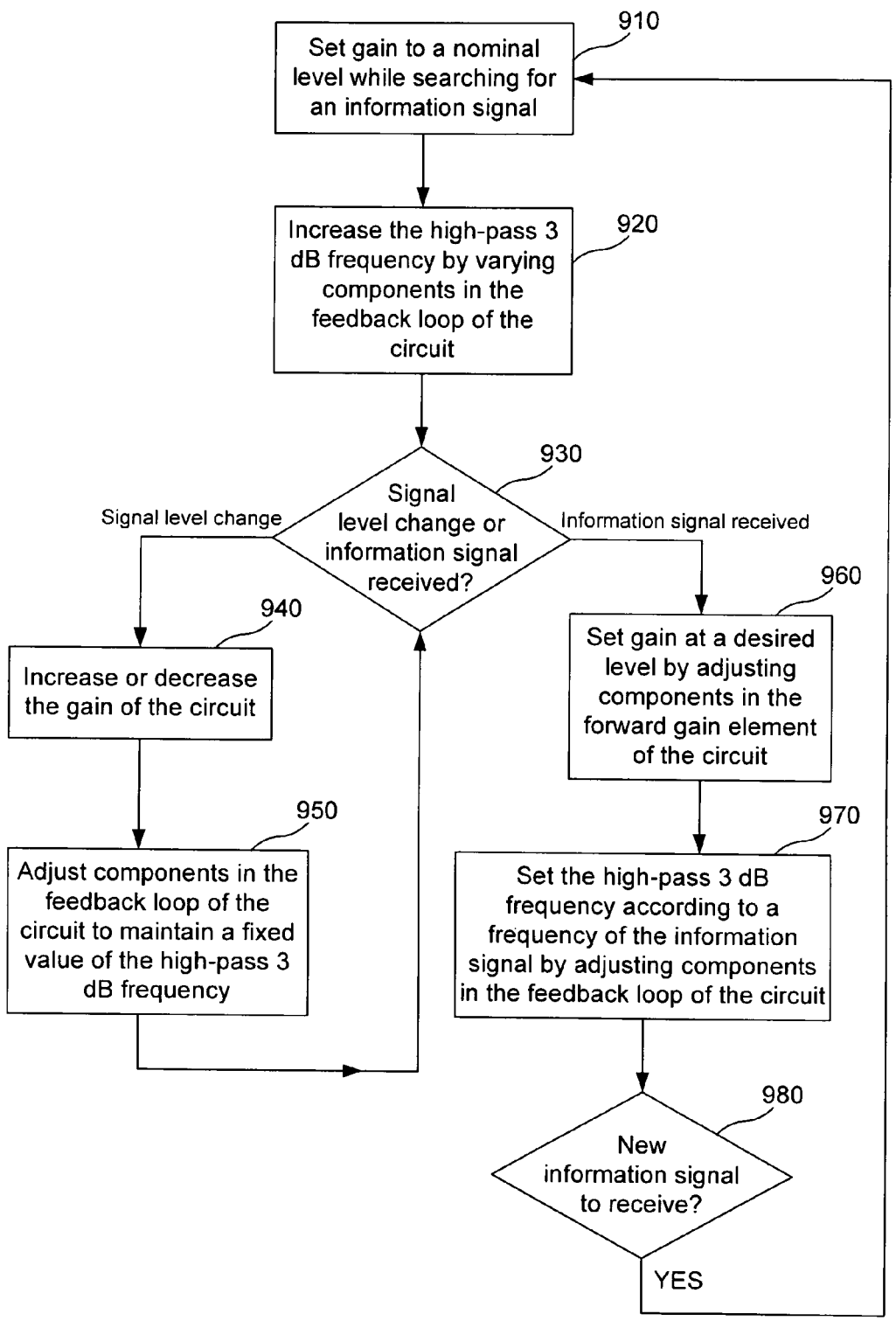
FIG. 9 is an operational flowchart of a method for controlling the gain and the roll-off frequency of a DC cancellation circuit according to an embodiment of the present invention.

FIG. 9 is a flowchart describing a method for receiving an information signal using a down-conversion receiver having a forward and a feedback gain element. The method of FIG. 9 can also be considered to describe a method for independently operating a gain control scheme and a DC cancellation strategy.

In step 910, the gain of the receiver circuit is set to a nominal level while searching for an information signal.

In step 920, the high-pass 3 dB frequency is increased by varying components in the feedback loop of the circuit.

In step 930, the receiver enters a state where it monitors for any signal level change or a new information signal to be received.

If a signal level change requiring a change in gain is detected, the method will branch into step 940 where the gain of the circuit is increased or decreased as appropriate. In one embodiment, the gain of the circuit is varied by varying the ratio of components in the forward gain element of the circuit (e.g. $R_3/R_1$ in FIG. 5). The conditions that govern when a signal level change is deemed significant to vary the gain level is within the scope of the gain control scheme being used. In one embodiment, the gain is changed according to a value of a windowed time-average of the signal level.

In step 950, the high-pass 3 dB frequency is re-adjusted for any change due to the change in gain in step 940, thereby maintaining a fixed value of the high-pass frequency independently of the change in gain. In one embodiment, any change in the high-pass 3 dB frequency is cancelled by adjusting component values in the feedback loop of the circuit (e.g. $R_2$ or $R_4$ in FIG. 5). At the end of step 950, the method returns to step 930.

On the other hand, if a new information signal is detected in step 930, the method will branch into step 960.

In step 960, the gain of the receiver circuit is set at a desired level for signal reception. Typically, a series of measurements of the received signal level are made before the gain of the circuit is determined. In an embodiment, the gain is set by adjusting component values in the forward gain element of the circuit. For example, in the embodiment of FIG. 5, the gain is adjusted by adjusting the ratio of $R_3/R_1$.

In step 970, the high-pass 3 dB frequency of the circuit is set according to a frequency of the information signal for information demodulation. In one embodiment, the high-pass 3 dB frequency is set lower than the lowest frequency content in the information signal. In an embodiment, the high-pass 3 dB frequency is set by adjusting component values in the feedback gain element of the circuit, thereby not affecting the value of the gain of the circuit. For example, in the embodiment of FIG. 5, the 3 dB frequency can be adjusted by adjusting $R_2$ or $R_4$.

In step 980, the receiver returns to step 910 if a new information signal is to be received.

Figure 8:
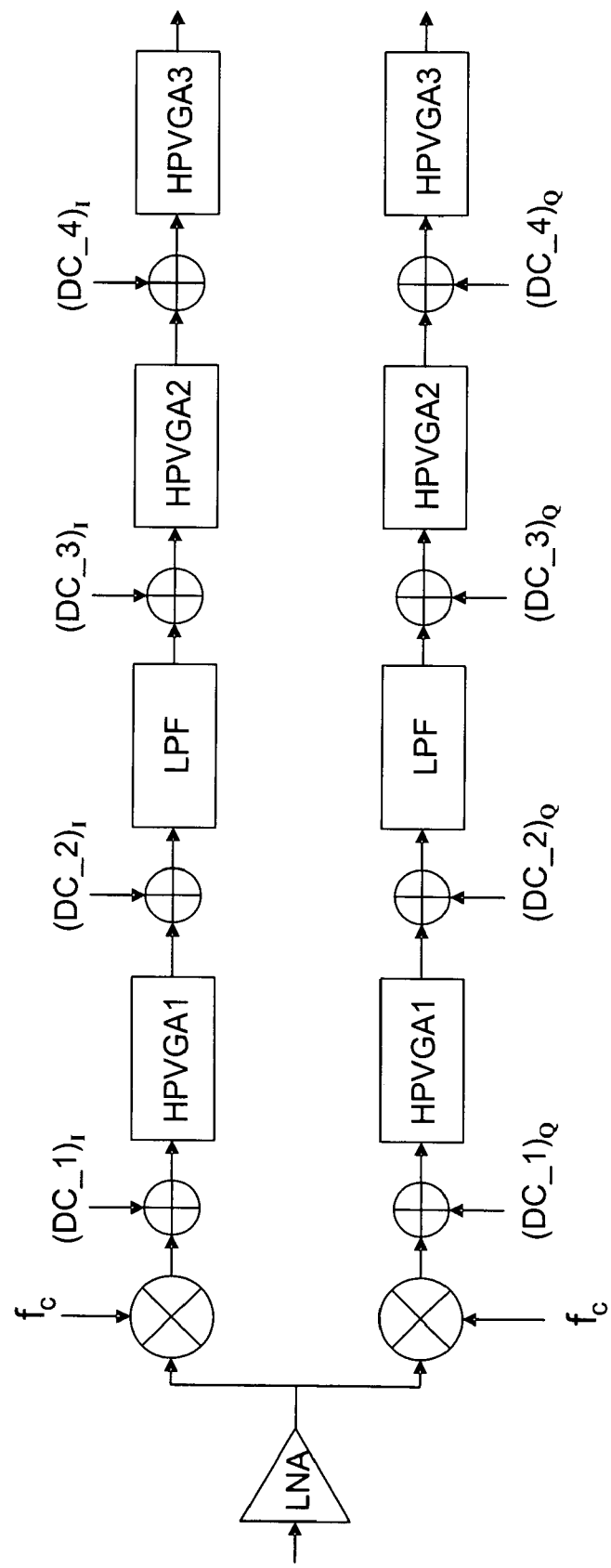
FIG. 8 is a block diagram that illustrates a multi-stage DC cancellation circuit configuration according to an embodiment of the present invention.

FIG. 8 is a block diagram that illustrates a multi-stage DC cancellation circuit configuration according to an embodiment of the present invention. In FIG. 8, a plurality of DC cancellation circuits (HPVGA1, HPVGA2, . . . ) are used in series in each of the I and Q channels of the receive path. As illustrated, a DC offset level gets introduced after each stage in the receive path requiring this multi-stage DC cancellation configuration. As can be understood by a person skilled in the art(s), controlling the gain and the roll-off frequency of the entire multi-stage cancellation circuit can be done by controlling the gain and roll-off frequency of one or more of the individual DC cancellation circuits.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A circuit, comprising:
an input terminal for receiving an input signal;
a forward gain element, coupled to said input terminal, including a first operational amplifier, a first impedance, and a second impedance, wherein a gain of the forward gain element is responsive to a ratio of the first impedance and the second impedance;
an output terminal taken from an output of the first operational amplifier;
a feedback gain element, coupled to the output of the forward gain element, including a second operational amplifier, a third impedance, and a capacitance; and
a scaling impedance coupled between an output of the feedback gain element and the input terminal, wherein the scaling impedance scales a DC signal at the output of the feedback gain element to reduce a DC component of the input signal, and wherein a value of the scaling impedance is variable.

2. The circuit of claim 1, wherein a sum of the first and second impedance is a fixed value.

3. The circuit of claim 1, wherein a gain frequency response of the feedback gain element is responsive to the ratio of the third impedance and the capacitance, and is inversely proportional to frequency, thereby attenuating high frequency input signals.

4. The circuit of claim 1, wherein a value of the third impedance is variable.

5. The circuit of claim 1, wherein a gain frequency response of the circuit tends towards the gain of the forward gain element for high frequency input signals.

6. The circuit of claim 5, wherein a gain frequency response of the circuit tends towards zero for low frequency input signals.

7. The circuit of claim 6, wherein a high-pass roll-off frequency of the gain frequency response of the circuit is responsive to the second impedance, the third impedance, the scaling impedance and the capacitance.

8. A circuit, comprising:
an input terminal for receiving an input signal;
a forward gain element, coupled to said input terminal, including a first operational amplifier, a first impedance, and a second impedance, wherein a gain of the forward gain element is responsive to a ratio of the first impedance and the second impedance;
an output terminal taken from an output of the first operational amplifier;
a feedback gain element, coupled to the output of the forward gain element, including a second operational amplifier, a third impedance, and a capacitance; and
a scaling impedance coupled between an output of the feedback gain element and the input terminal, wherein the scaling impedance scales a DC signal at the output of the feedback gain element to reduce a DC component of the input signal;
wherein a gain of the circuit is set by fixing the ratio of the first and second impedances; and
wherein a high-pass roll-off frequency of the gain frequency response of the circuit is set by adjusting the third impedance and the scaling impedance.

9. The circuit of claim 8, wherein the gain and the high-pass roll-off frequency are set independently of each other.

10. The circuit of claim 9, wherein the circuit operates in a plurality of modes, each of the plurality of modes defined by a value of the high-pass roll-off frequency.

11. The circuit of claim 10, wherein the circuit operates in a programmable slow mode for information demodulation, the value of the high-pass roll-off frequency in said mode set according to a lowest frequency component of a received information signal.

12. The circuit of claim 11, wherein the circuit operates in a programmable fast mode for DC offset elimination, the value of the high-pass roll-off frequency in said mode set high enough to eliminate any DC offset in the received information signal within a pre-determined time duration.

13. The circuit of claim 12, wherein the circuit is toggled from the slow mode to the fast mode after the received information signal is demodulated.

14. The circuit of claim 12, wherein the circuit is toggled from the fast mode to the slow mode after the DC offset is eliminated.

15. The circuit of claim 8, wherein a change in the high-pass roll-off frequency due to a change in the gain is canceled by adjusting the third or the scaling impedance.

16. A circuit comprising:
a first gain element having a positive input terminal, a negative input terminal coupled to a ground reference voltage, and an output terminal coupled to an output terminal of the circuit;
a first impedance coupled between an input terminal of the circuit and the positive input terminal of the first gain element;

a second impedance coupled between the positive input terminal and the output terminal of the first gain element;

a second gain element having a positive input terminal, a negative input terminal coupled to a ground reference voltage, and an output terminal;

a third impedance element coupled between the output of the first gain element and the positive input terminal of the second gain element;

a capacitive element coupled between the positive input terminal and the output terminal of the second gain element; and a fourth impedance coupled between the output terminal of the second gain element and the positive input terminal of the first gain element.

* * * * *